(12) United States Patent
Moewes et al.

(10) Patent No.: US 6,204,675 B1
(45) Date of Patent: Mar. 20, 2001

(54) DEVICE FOR INSERTING AT LEAST ONE SEMICONDUCTOR COMPONENT INTO A RECEPTACLE

(75) Inventors: Harro Moewes, Engelskirchen; Hans-Joachim Kremer, Kuerten, both of (DE)

(73) Assignee: MCI Computer GmbH, Engelskirchen (DE)

( * ) Notice: Subject to any disclaimer, the term of this patent is extended or adjusted under 35 U.S.C. 154(b) by 0 days.

(21) Appl. No.: 09/171,177
(22) PCT Filed: Apr. 18, 1997
(86) PCT No.: PCT/EP97/01948
 § 371 Date: Oct. 14, 1998
 § 102(e) Date: Oct. 14, 1998
(87) PCT Pub. No.: WO97/40393
 PCT Pub. Date: Oct. 30, 1997

(30) Foreign Application Priority Data

Apr. 19, 1996 (DE) .............................. 196 15 674

(51) Int. Cl.[7] .............................. G01R 31/02; A47J 45/00
(52) U.S. Cl. .......................................... 324/755; 294/64.3
(58) Field of Search .................... 324/761, 754, 324/755, 158.1; 439/70; 294/64.3

(56) References Cited

U.S. PATENT DOCUMENTS

| | | | |
|---|---|---|---|
| 4,009,785 | * 3/1977 | Trayes ................................. | 294/64.3 |
| 4,257,637 | * 3/1981 | Hassan et al. ....................... | 294/64.3 |
| 4,781,494 | 11/1988 | Cedrone et al. ..................... | 406/52 |
| 4,940,935 | * 7/1990 | Riley .................................... | 324/755 |
| 5,037,262 | * 8/1991 | Moll et al. ........................... | 414/222 |
| 5,169,196 | * 12/1992 | Sakabakhsh ........................ | 294/64.3 |
| 5,208,529 | 5/1993 | Tsurishima et al. ................. | 324/754 |
| 5,504,436 | 4/1996 | Okutsu ................................ | 324/755 |
| 5,894,217 | * 4/1999 | Igarashi et al. .................... | 324/158.1 |

OTHER PUBLICATIONS

IBM Technical Disclosure Bulletin, vol. 18, Mar. 1976 (3 pages).

* cited by examiner

*Primary Examiner*—Neil Abrams
(74) *Attorney, Agent, or Firm*—Birch, Stewart, Kolasch & Birch, LLP

(57) ABSTRACT

The device for inserting at least one semiconductor component into a receiving portion, particularly into a test socket for testing the electric function of the semiconductor component, comprises at least one receiving space (46) for the semiconductor component (12), the receiving space (46) comprising a receiving opening (56). Further, the device comprises at least one moveable member (14) supported on element (34) whereby semiconductor component (12) is carried in a moving direction (58) through said receiving opening (56) into the receiving space (46). The pushing element (34) comprising a gas cushion generating means (62) for generating a gas cushion (60) is adapted to support the semiconductor component (12) at least in the receiving opening (56). Heating and cooling means (68) are provided by which the air out-flowing as an air cushion (60) can be brought to a desired temperature (FIG. 2).

13 Claims, 3 Drawing Sheets

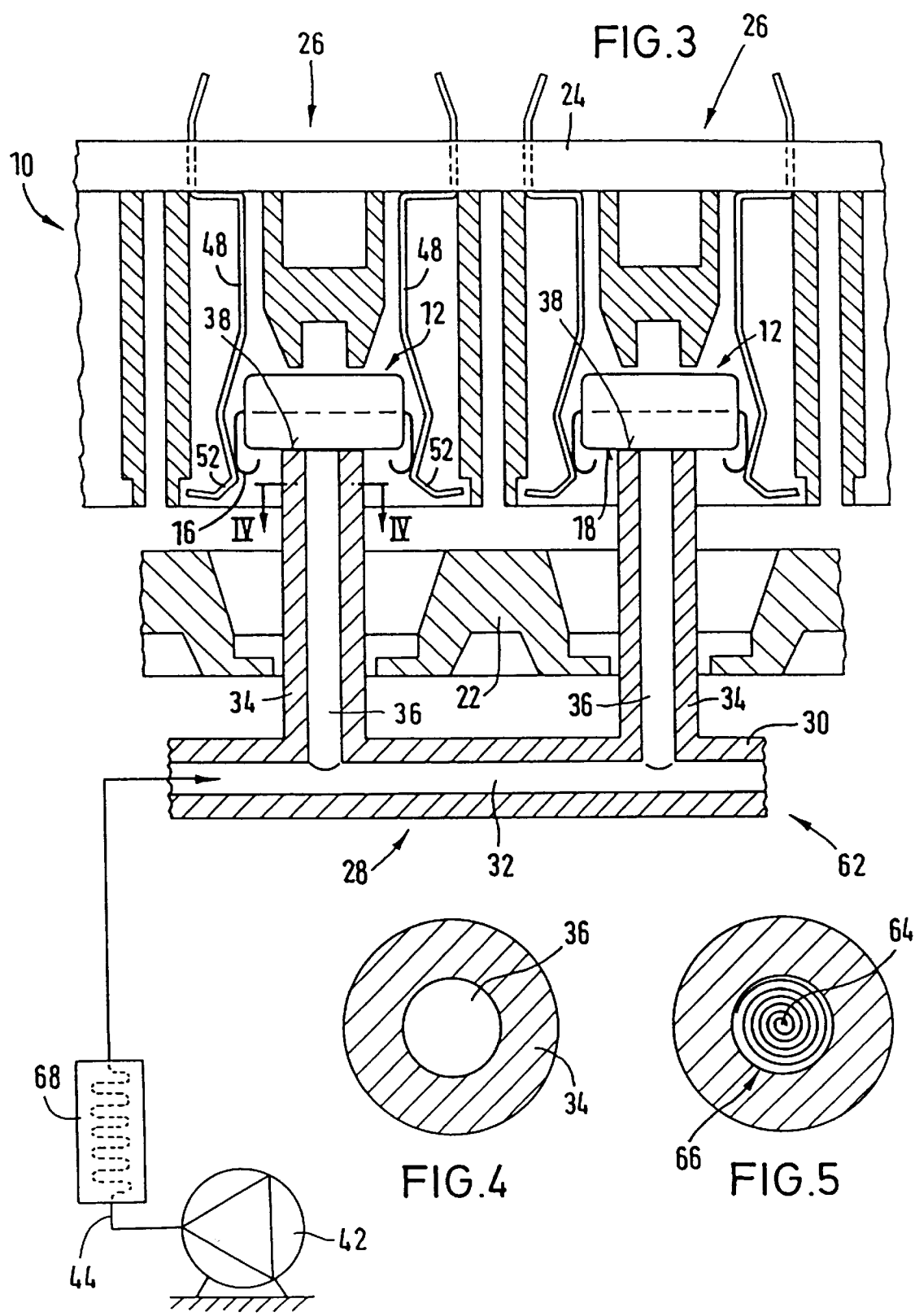

DEVICE FOR INSERTING AT LEAST ONE SEMICONDUCTOR COMPONENT INTO A RECEPTACLE

Figure 1:
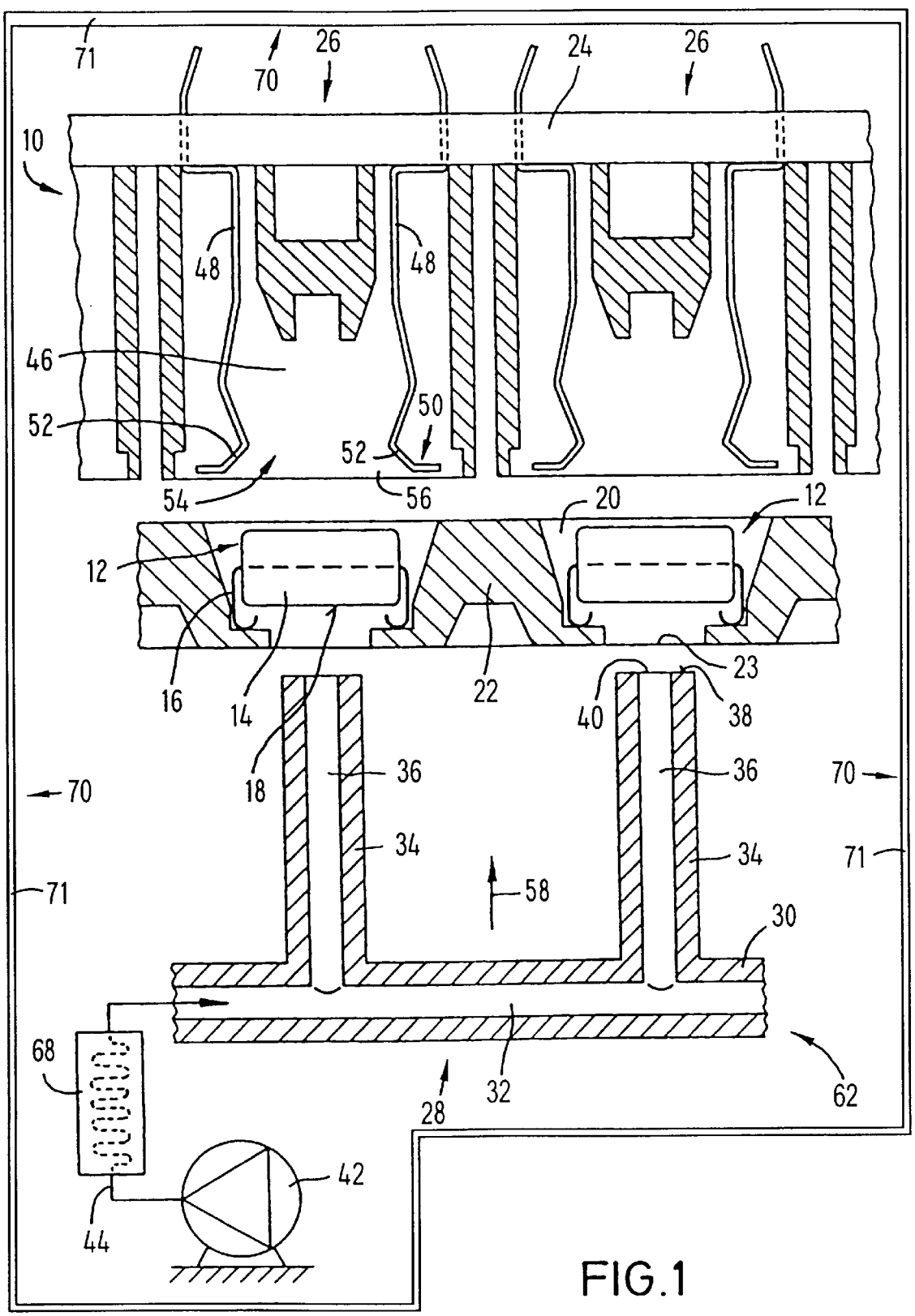

This application is the national phase under 35 U.S.C. §371 of prior PCT International Application No. PCT/EP97/01948 which has an International filing date of Apr. 18, 1997 which designated the United States of America, the entire contents of which are hereby incorporated by reference.

The instant invention relates to a device for inserting at least one semiconductor component into a receiving portion, particularly into a test socket for testing the electric function of the semiconductor component.

During the final assembly process of semiconductor components, e.g. IC devices, the components are subjected to different testing processes. For the testing of the electric functions of the semiconductor components, it is required that their contact legs are brought into electric contact with the contact pins of a test station. The test station comprises a plurality of test sockets with receiving spaces formed therein. The receiving spaces are adapted to have the semiconductor components automatically inserted thereinto through a receiving opening. The semiconductor components to be tested are arranged in deepened receiving portions of a transport tray which will be moved into a position under a test head of the test station. The test head comprises a plurality of test sockets positioned according to the configuration of the deepened receiving portions of the transport tray. The receiving spaces of the test sockets are open on their downward sides so that the semiconductor components, when lifted out of the deepened receiving portions of the transport tray, are moved into the receiving spaces of the test sockets. This movement is performed by use of moving elements shaped as stamp-like projections arranged on a common support.

When the semiconductor components or the IC devices are lifted out of the deepened receiving portions of the transport tray and moved into the receiving spaces of the test sockets, a danger exists that the semiconductor modules or the test socket are damaged. Often, the orientation of the semiconductor modules in the transport tray relative to the test head is not exact enough to accomplish a positionally correct lifting of the semiconductor modules into the receiving spaces of the test sockets. Instead, it is only by the force of the stamp-like moving elements that the semiconductor components can be pressed into the desired position, out of which they can then be pushed through the receiving openings into the receiving spaces of the test sockets. In the process, it may occur that the contact legs of the semiconductor components are deformed by bending. Further, due to the massive friction caused by the semiconductor components, the test sockets will wear out relatively quickly and thus have to be replaced frequently.

It is an object of the invention to provide a device for inserting at least one semiconductor component into a receiving portion, wherein the danger of damage to the semiconductor component and/or the receiving portion is reduced.

For solving the above object, the instant invention provides a device for inserting at least one semiconductor component into a receiving portion, particularly into a test socket for testing the electric function of the semiconductor component, which device comprises at least one receiving space for the semiconductor component, said receiving space having a receiving opening, and at least one moving element for moving the semiconductor component in a moving direction through said receiving opening into said receiving space, said moving element comprising a gas cushion generating means for generating a gas cushion adapted to lift the semiconductor component at least into said receiving opening.

The device according to the invention comprises, for each semiconductor component to be moved, a moving element provided with a gas cushion generating means. At least during the period of the movement of the semiconductor component—when the semiconductor component is moved into a position in the receiving opening—a gas cushion is arranged between the end of the moving element facing the semiconductor component and the semiconductor component itself. Thus, while the semiconductor component is moved into the receiving space from below, it is floating on the gas cushion until entering the receiving opening of the receiving space. Within the receiving opening, the semiconductor component is centered, with the semiconductor component moving relative to the moving element. Since the moving element does not yet mechanically abut the semiconductor component, the centering process for the semiconductor component is gentle both on the semiconductor component itself and on the receiving portion which, in case of an IC test station, is a test socket. This considerably reduces wear and the risk of damage.

Therefore, by use of the inventive device, semiconductor components, while being transferred into a receiving portion such as a test socket for testing the electric function of the semiconductor component, can be moved in a gentle manner by application of only a small force and at low friction. Depending on the respective design of the semiconductor component and the receiving portion, the complete insertion of the semiconductor component into the receiving space may require larger moving forces than can be generated by the gas cushion. This, for instance, is the case in test sockets for SOJ-ICs. In these test sockets, the contact legs of the IC device must be brought into mechanical contact with spring-biased contact lugs of a test socket. This requires a certain minimum force which possibly cannot be generated anymore in that the moving element with the gas cushion generated thereon is advanced towards the semiconductor component without touching the semiconductor component. Therefore, it may happen that, after the centering of the semiconductor component in the receiving space of the test socket for SOJ-ICs, the complete insertion of the SOJ-ICs into the test socket is performed by the moving element abutting the semiconductor component and inserting it into the test socket by advance movement.

A slightly different situation exists in the case of TSOP-ICs, which merely require that their contact legs are brought into abutment with abutment faces of the test socket; this is because the electrical contacting is performed by contacting elements which, by actuation of a corresponding actuating element of the test socket, are electrically contacted with the contact legs of the TSOP-ICs. In such an application of the gas cushion generating means according to the invention, the gas cushion should in any case be sufficient for moving the semiconductor component fully into the receiving space of a receiving portion without a mechanical contact with the moving element.

In a preferred embodiment of the invention, it is provided that the gas cushion generating means comprises at least one gas outlet orifice, which is formed in the front face—directed towards the semiconductor component—of the moving element assigned to the semiconductor component. Preferably, this gas outlet orifice is provided as a diffusor.

The diffusor is preferably formed as a spiral arranged in the gas outlet orifice.

Further, the gas cushion generating means is preferably provided with a gas flow generating means which is connected, via gas feed conduits, to the gas outlet orifices of the moving elements. Preferably, a plurality of moving elements are arranged on a common support to allow a simultaneous insertion of a plurality of semiconductor components into receiving portions assigned thereto. The gas feed conduits of the moving elements are connected to each other and coupled in common to the gas flow generating means.

In a preferred embodiment of the invention, it is further provided that the gas flow generating means is configured as a closed air circuit, thus returning the gas issuing from the gas outlet orifices to the gas feed conduits.

Basically, a large variety of fluids can be used for generating the gas cushion. However, the use of air is most suitable.

Preferably, the gas cushion generating means is provided with a heating/cooling means for tempering the gas forming the gas cushion. Such an arrangement offers the advantage that the onflow of tempered gas can be utilized to bring the to-be-tested semiconductor components to a desired temperature so that the function of the semiconductor components can be tested at these temperatures.

According to a suitable embodiment of the invention, it is further provided that the complete device is arranged in a housing which is sealed against the environment and particularly is thermally insulated against the environment.

Embodiments of the invention will be explained in greater detail hereunder with reference to the Figures.

Figure 2:
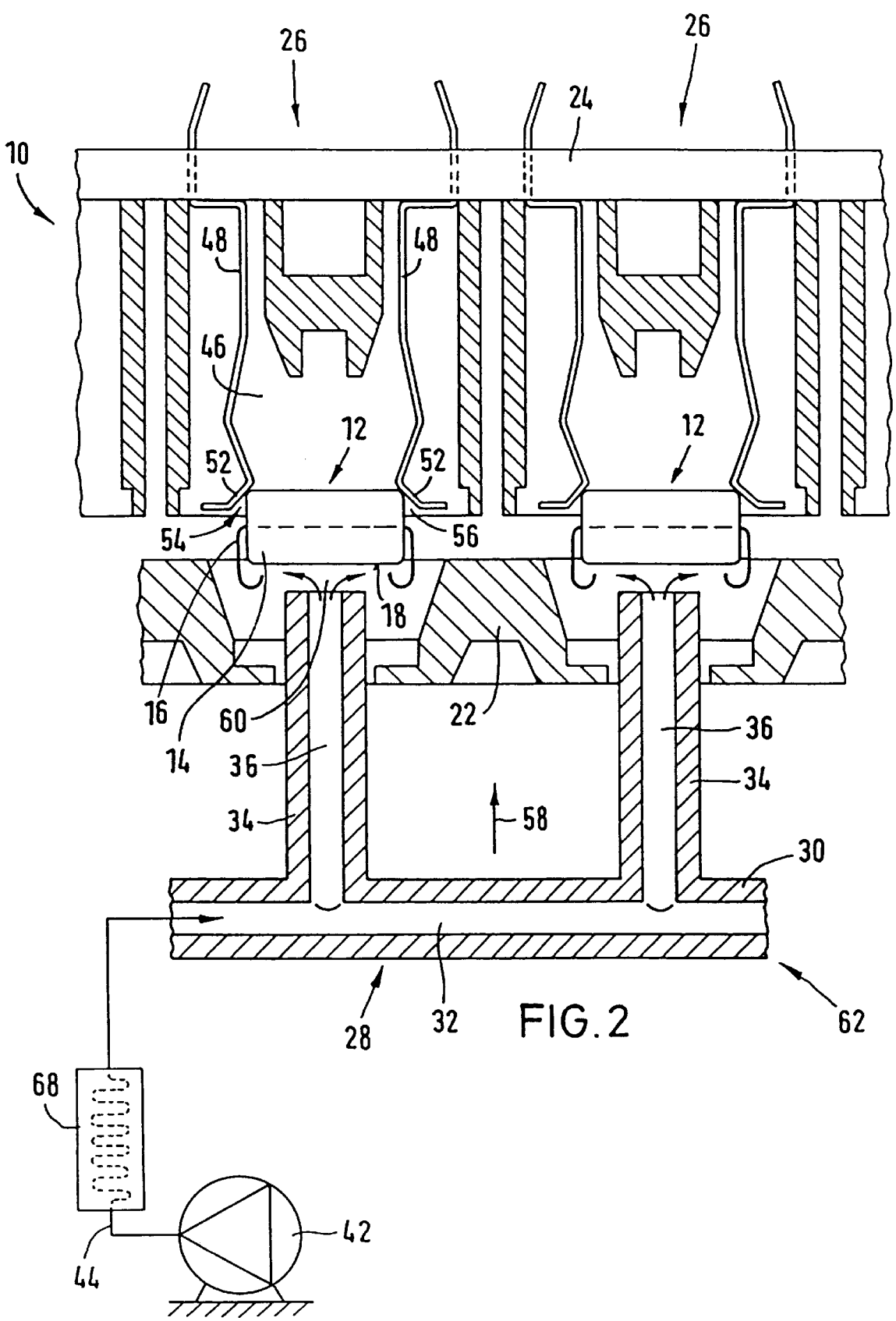

FIG. 1 is a schematic cross-sectional view of a test station for semiconductor components, with the semiconductor components arranged in deepened receiving portions of a transport tray, FIG. 2 is a sectional view similar to FIG. 1, with the semiconductor components lifted out of the deepened receiving portions of the transport tray and centered and pre-positioned in the receiving spaces of the test sockets, FIG. 3 is a sectional view of the test station, with the semiconductor components completely moved into the test sockets by the moving elements, FIG. 4 is a sectional view along the plane IV—IV of FIG. 3, and FIG. 5 is a sectional view similar to FIG. 4 showing an alternative embodiment of the invention.

FIGS. 1 to 3 show different sectional views of the test station 10 in different operational positions. The test station 10 serves for testing the electric functions of IC devices 12. Each IC device 12 comprises a plastics housing 14, with contacts legs 16 laterally projecting out of housing 14. The contacts legs 16 are angled in a downward direction and have their ends bent towards the bottom side 18 of housing 14. The semiconductor components are arranged in deepened receiving portions 20 of a transport tray 22 in which they are transferred into the test station 10. The transport tray 22 has its bottom side formed with cut-out portions 23 connected to the deepened receiving portions 20. Thus, the deepened receiving portions 20 and the cut-out portions 23 form throughholes extending vertically through the transport tray 22. Within the test station 10, the transport tray 22 is arranged between a test head 24 comprising a plurality of test sockets 26, and a moving organ 28 for transferring the IC devices 12 from the deepened receiving portions 20 into the test sockets 26 of the test head 24. The moving organ 28 comprises a support plate 30 having a channel 32 extending therethrough along its major surface. The support plate 30 further comprises a plurality of projecting moving elements 34 positioned corresponding to the arrangement of the deepened receiving portions 20 of the transport tray 22. The moving elements 34 have channels 36 extending therethrough which are connected to channel 32. The channels 36 terminate on the free ends 38 of the moving elements 34 facing away from plate 30. These ends 38, which are facing towards the bottom sides 18 of the IC housings 14, are provided with orifices 40.

The moving organ 28 is connected to an air-flow generating pump 42 supplying air to the channel 32 via a connecting line 44. This air is discharged from the moving elements 34 via the channels 36 and the orifices 40.

Each of the test sockets 26 comprises a receiving space 46 for receiving an IC device 12. Within receiving space 46, contact lugs 48 are arranged for electrically contacting the contact legs 16 of the IC devices 12. On their free ends 50 facing towards the moving elements 34, the contact lugs 48 comprise oblique portions 52 forming a centering region 54 for the IC devices 12. These free ends 50 further define a receiving opening 56 of the receiving space 46, allowing access to the space 46 from outside.

The process of the automatic insertion of the IC devices 12 into the receiving spaces 46 of the test sockets 26 will be briefly outlined hereunder.

With the moving organ 28 positioned at a distance from test head 24, the transport tray 22 carrying the IC devices 12 provided for testing is moved between moving organ 28 and test head 24. This situation is illustrated in FIG. 1. Then, the moving organ 28 is linearly moved in the direction of arrow 58 so that the stamp-like moving elements 34 are guided through the cut-out portions 23 of the deepened receiving portions 20 until taking a position close to the bottom sides 18 of the IC housings 14. During this advance movement, gas is issued from the discharge orifices 40 at a sufficient pressure to raise the IC devices 12, i.e. to cause them to float, as it were, on an air cushion 60. In this manner, the IC devices 12 are lifted and moved through the receiving openings 56 up into the receiving spaces 46 of the test sockets 26, where they are centered by the oblique portions 52 of the contact lugs 48. This situation is illustrated in FIG. 2. In this situation, the contact lugs 48 are abutted either by the IC housings 14 or already by the contact legs 16.

To establish a reliable electric contact between the contact lugs 48 of the test sockets 26 and the contact legs 16 of the IC devices 12, it is required that the IC devices 12 are moved deeper into the test sockets 26 so as to be received completely by the receiving spaces 46. For this purpose, the moving organ 28 is advanced further in the direction of arrow 58 so that the free ends 38 of the moving elements 34 will abut the bottom sides 18 of the IC housings 14 and the IC housings 14 will thus be moved by the moving elements 34 into the receiving spaces 46 of the test sockets 26. This situation is illustrated in FIG. 3. Then, the moving organ 28 is retracted while the IC devices 12 are held in the test sockets 26 by the clamping force of the contact lugs 48 bearing against the contacts legs 16 of the IC devices 12. Now, the IC devices 12 are tested for their electric functions. Then, the IC devices 12 will be moved out of the test sockets 26 and into the deepened receiving portions 20 of the transport tray 22 by a mechanism not explained in greater detail herein, and the transport tray 22 is moved out of the test station 10.

As described above and illustrated in FIGS. 1 to 3 the air cushion generating means 62, comprising the moving organ 28 with channels 32 and 36 and the pump 42, allows for a gentle positioning of the IC devices 12 in the region of the receiving openings 56 of the test sockets 26, thus reducing wear and the risk of damage both for the IC devices 12 and the test head 24.

FIG. 5 shows an alternative embodiment of the discharge orifices 40 of the moving elements 34. According to FIG. 5, the orifices 40 have spiral elements 64 arranged therein and thus are formed as diffusor orifices 66. This embodiment makes it possible to use the test station 10 in an especially simple manner to test the electric functions at different temperatures of the IC devices 12. For this purpose, the air flow system is provided with a heating and cooling means 68 by which the air out-flowing as an air cushion 60 can be brought to a desired temperature. Thus, the test station 10 is useful for testing the IC devices 12 at low temperatures (e.g. down to −50° C.), at room temperatures and at high temperatures (e.g. up to about 85° C.) alike. Especially in case of measurements performed at high and low temperatures, to keep energy losses low as shown in FIG. 1, the test station 10 should be provided with housing (70) for a closed air circuit so as to prevent discharge of heated or cooled air from the test station 10 into the environment and an intrusion of ambient air into the test station 10. For reasons of surveyability and to allow a better understanding of the invention, the air recirculating system required for the closed air system is not shown in the Figures. The housing (70) may be provided with thermal insulation means (71).

To provide a uniform tempering of the test station 10 in high- and low-temperature measurements, the test station 10 and the test head 24, respectively, should be provided with heating and/or cooling means. For instance, the test head 24 can be formed as a block housing with cooling or heating provisions. Additionally, it is of advantage to thermally insulate the test head 24.

What is claimed is:

1. A device for inserting at least one semiconductor component into a receiving portion, particularly into a test socket for testing the electric function of the semiconductor component, said device comprising:
   (i) at least one receiving space (46) for the semiconductor component (12), said receiving space (46) comprising a receiving opening (56), and
   (ii) at least one pushing element (34) for pushing the semiconductor component (12) in a pushing direction (58) through said receiving opening (56) into said receiving space (46),
   (iii) said pushing element (34) comprising a gas cushion generating means (62) for generating a gas cushion (60) for centering the semiconductor component (12) within said receiving opening (56) prior to pushing the semiconductor component (12) into said receiving space (46).

2. The device according to claim 1, wherein said pushing element (34) comprises a front face (38), oriented towards the pushing direction (58) and arranged to confront the semiconductor components (12) during the movement of said pushing element, and wherein said gas cushion generating means (62) comprises at least one gas discharge orifice (40) formed in said front face (38) of said pushing element (34).

3. The device according to claim 2, wherein said gas discharge orifice (40) is formed as a diffusor (66) or comprises a diffusor (66).

4. The device according to claim 3, wherein said diffusor (66) comprises a spiral (64).

5. The device according to claim 2, wherein said gas cushion generating means (62) comprises at least one gas feed conduit (32, 36) leading to said gas discharge orifice (40), said at least one gas feed conduit (32, 36) being arranged in or at said pushing element (34) and originating at an air-flow generating means (42).

6. The device according to claim 1, wherein a plurality of pushing elements (34) are provided, which are arranged on a common support (30).

7. The device according to claim 5, wherein said gas feed conduits (32, 36) of said pushing elements (34) are connected to each other.

8. The device according to claim 1, wherein a heating/cooling means (68) is provided for tempering said gas.

9. The device according to claim 1, wherein said gas cushion generating means (62) comprises a closed gas circuit.

10. The device according to claim 1, wherein said device is arranged in a housing sealed against the environment.

11. The device according to claim 10, wherein said housing is provided with means for thermal insulation (71).

12. The device according to claim 10, wherein said housing is provided with at least one heating and/or cooling means.

13. A method of protecting a semiconductor component during a test which comprises inserting at least one semiconductor component into a receiving portion of a device, particularly into a test socket for testing the electric function of the semiconductor component, said device comprising:
   (i) at least one receiving space (46) for the semiconductor component (12), said receiving space (46) comprising a receiving opening (56),
   (ii) at least one pushing element (34); (b) pushing the semiconductor component (12) in a pushing direction (58) through said receiving opening (56) into said receiving space (46), wherein said pushing element (34) further comprises a gas cushion generating means (62); and
   (iii) generating a gas cushion (60) for centering the semiconductor component (12) within said receiving opening (56) and subsequently pushing the semiconductor component (12) into said receiving space (46), whereby said semiconductor component is safely positioned for testing without undue wear or damage to said component.

* * * * *